US007840189B2

(12) United States Patent
Kelleher et al.

(10) Patent No.: US 7,840,189 B2
(45) Date of Patent: Nov. 23, 2010

(54) FREQUENCY GENERATION IN A WIRELESS COMMUNICATION UNIT

(75) Inventors: Paul Kelleher, Classis Lake Ovens (IE); Conor O'Keeffe, Douglas (IE)

(73) Assignee: Freescale Semiconductor, Inc., Austin, TX (US)

( * ) Notice: Subject to any disclaimer, the term of this patent is extended or adjusted under 35 U.S.C. 154(b) by 629 days.

(21) Appl. No.: 11/721,656

(22) PCT Filed: Dec. 15, 2004

(86) PCT No.: PCT/EP2004/053500

§ 371 (c)(1),
(2), (4) Date: Jun. 13, 2007

(87) PCT Pub. No.: WO2006/063619

PCT Pub. Date: Jun. 22, 2006

(65) Prior Publication Data

US 2009/0117856 A1    May 7, 2009

(51) Int. Cl.
H04B 1/40    (2006.01)
(52) U.S. Cl. ............................ 455/75; 455/76; 455/118; 455/123; 375/344; 331/18
(58) Field of Classification Search .................. 455/75, 455/76, 118, 119, 123, 125, 138, 139, 85, 455/86, 147; 375/344; 331/18, 25
See application file for complete search history.

(56) References Cited

U.S. PATENT DOCUMENTS

| 5,111,162 | A  | * | 5/1992 | Hietala et al. ............... 332/127 |
| 5,721,514 | A  | * | 2/1998 | Crockett et al. ................ 331/3 |
| 6,078,790 | A  | * | 6/2000 | Oh et al. ...................... 455/75 |
| 6,504,498 | B1 |   | 1/2003 | O'Brien |
| 6,697,415 | B1 | * | 2/2004 | Mahany ...................... 375/130 |
| 6,803,796 | B2 | * | 10/2004 | Huang et al. ................... 327/99 |
| 6,941,116 | B2 | * | 9/2005 | Jensen et al. .................. 455/76 |
| 6,985,708 | B2 | * | 1/2006 | Lin et al. ..................... 455/260 |
| 7,171,183 | B2 | * | 1/2007 | Chien ......................... 455/260 |
| 7,463,710 | B2 | * | 12/2008 | Walsh et al. ................. 375/376 |
| 7,474,709 | B2 | * | 1/2009 | Baker et al. ................. 375/303 |
| 7,616,069 | B2 | * | 11/2009 | Li ............................... 331/25 |
| 2003/0138034 | A1 |   | 7/2003 | Shi et al. |
| 2003/0139202 | A1 |   | 7/2003 | Doi et al. |
| 2003/0176173 | A1 |   | 9/2003 | Klemmer |
| 2004/0037379 | A1 |   | 2/2004 | Khlat |
| 2006/0035597 | A1 | * | 2/2006 | Lin et al. ...................... 455/76 |
| 2009/0160565 | A1 | * | 6/2009 | Kawamoto ................... 331/1 A |

FOREIGN PATENT DOCUMENTS

EP    1226452 B1    3/2003

(Continued)

Primary Examiner—Minh D Dao

(57) ABSTRACT

A wireless communication device comprises a frequency generation circuit employing a crystal oscillator operably coupled to a fractional-based synthesiser and a voltage-controlled oscillator. The fractional-based synthesiser utilises a ratio between an integer value and a fractional value to set a radio frequency signal of the voltage-controlled oscillator. An automatic frequency control scaling sub-system is operably coupled to a fractional-based synthesiser and configured to receive and use an AFC word to frequency scale the fractional value in a multiplicative manner to set a radio frequency supported by the fractional-based synthesiser. Preferably, an automatic frequency generation sub-system utilises Absolute Radio Frequency Channel Number and the cyclical nature of the fractional value.

In this manner, a saving on hardware and software overheads associated with frequency channel selection for fractional-N type synthesizers can be made.

16 Claims, 3 Drawing Sheets

FOREIGN PATENT DOCUMENTS

| WO | 9512253 | | 5/1995 |
| WO | 9728606 | A1 | 8/1997 |
| WO | 0133249 | A2 | 5/2001 |
| WO | 0229978 | A2 | 4/2002 |

* cited by examiner

FREQUENCY GENERATION IN A WIRELESS COMMUNICATION UNIT

FIELD OF THE INVENTION

This invention relates to frequency generation circuits for wireless communication devices. The invention is applicable to, but not limited to, a frequency generation circuit that uses fractional 'N' synthesiser technology.

BACKGROUND OF THE INVENTION

Wireless communication devices, for example those operating in a cellular telephone system such as the Global System for Mobile communications (GSM), use a broadcast reference frequency signal, for example a Frequency Correction Channel (FCCH), to calibrate their operating (transmit/receive) frequency. The broadcast signal is generally transmit from one or more base transceiver stations (BTSs). The wireless communication devices use the frequency correction signal to synchronise their internal frequency generation circuits to a centralised timing system. The units synchronise their operating frequency to match the system frequency, prior to entering into a communication.

There are many known techniques for synthesizing modulated signals onto frequencies for transmission. A popular technique at present is one that uses a fractional division synthesizer, which enables a wide range of discrete frequencies to be tuned to by appropriate selection of 'division' parameters applied to a reference oscillator.

The 3$^{rd}$ Generation Partnership Project 3GPP (previously standardised by European Telecommunication Standards Institute (ETSI)) has defined a frequency accuracy for digital cellular telecommunications, with one specification for the Global System for Mobile Communications (GSM) being defined in 'Radio Transmission and Reception for Digital Cellular Telecommunication System in 3GPP TS 05.05'. This standard also specifies operating frequencies for Quad band enhanced general packet radio system (EGPRS) transceivers that cover low band GSM850, enhanced GSM (EGSM) and high band DCS1800 and PCS1900 frequencies.

The standard specifies that enhanced GSM transmitters (Tx) and receiver (Rx) local oscillators (LO) need to have very accurate frequencies, with a frequency error of better than 0.1 ppm (parts per million). Thus, for example, the oscillator error has to be less than 90 Hz on a 900 MHz GSM carrier frequency and 180 Hz on an 1800 MHz GSM carrier. Errors in the Tx and Rx LO frequencies are a function of the reference frequency of the crystal or the Voltage Temperature compensated Crystal Oscillator (VTCXO) reference used in the phase locked loop (PLL) circuits for generating these frequencies. The frequencies of these devices vary as a function of temperature supply voltage to the oscillator circuits, as well as due to ageing of the devices.

Such accurate frequencies can be generated in current wireless communication units primarily by one of two methods:
 (i) A voltage, temperature-controlled crystal oscillator (VTCXO). The accuracy of a VTCXO has a typical free running tolerance of the order of 2 ppm. These circuits need a digital-to-analogue converter (DAC) to 'adjust' the final frequency accuracy; and
 (ii) Typical free-running crystal units, which have a frequency tolerance of the order of 30 ppm. This is three hundred times the tolerance required by the transmitter. However, the improved frequency accuracy, in order to meet the 3GPP standard's requirements, is typically achieved by adjusting a divider feedback ratio in a fractional-'N' phase locked loop (PLL). Unfortunately, this involves calculating a new synthesiser feedback ratio for every single PLL frequency.

A VTCXO implementation costs approximately three times that of an XTAL-based implementation. Hence, with the manufacturing cost of wireless communication devices being a key factor in achieving success in such a mass-market field, use of an XTAL-based solution is highly desirable.

With a free-running XTAL-based implementation, calculating a new feedback ratio for every frequency channel is needed, and this requires a complex software algorithm. Automatic frequency control (AFC) circuitry is also needed, whereby an AFC value needs to be updated every time a new frequency is selected, or at least every time that a new AFC calculation is performed. In contrast, the VTCXO system only needs updating once a new frequency error is calculated.

A fractional 'N' based frequency generation approach is described in PCT Patent Application: WO97/28606 A1, by Motorola, Daniel et al., titled "Method and apparatus for controlling a fractional-n synthesiser in a time division multiple access system". This patent application describes a method for controlling a fractional-N synthesizer in a time division multiple access system by receiving timeslot and frequency information and determining a potential offset value from a look-up table based on the timeslot and the frequency information. The microprocessor then utilizes the potential offset value, the current timeslot and the current operating frequency to determine the offset to be applied to the divider control circuit of the fractional-N synthesizer. However, the patent application does not describe how the offsets in the look-up table are generated or how the offsets (fractional values) are related to the reference frequency or the frequency step of the voltage-controlled oscillator.

An alternative approach is described in PCT patent application; WO95/12253, by Motorola Inc., and Alex Hietala and Duane Rabe, titled "Automatic Frequency control apparatus", for a digital AFC system where the AFC is applied to the Feedback divider of a fractional-n synthesiser. Here, an AFC word has to be calculated and sent to the Synthesiser for each new frequency.

Thus, a need has arisen to provide a wireless communication device, an application specific integrated circuit and a method of generating a frequency signal, wherein the aforementioned disadvantages may at least be alleviated.

STATEMENT OF INVENTION

In accordance with preferred embodiments of the present invention, there is provided a wireless communication device, an integrated circuit and a method of generating a frequency signal as defined in the appended Claims.

BRIEF DESCRIPTION OF THE DRAWINGS

Exemplary embodiments of the present invention will now be described, with reference to the accompanying drawings, in which.

DESCRIPTION OF PREFERRED EMBODIMENTS

In summary, the inventive concepts described hereinafter utilise aspects of the software simplicity of the VTCXO tuning algorithm, advantageously with none of the associated extra hardware system costs or complexity. A fractional 'N' frequency synthesizer is configured to use a division ratio comprising an integer and fractional part. As known, the division ratio selects the desired channel frequency.

Notably, a novel element of a multiplicative scaling function has been added to an AFC correction apparatus. Known AFC apparatus may 'add' a pre-calculated value to a numerator word for each channel frequency change of a fractional 'N' synthesiser. This has been identified as being inefficient by the inventors of the present invention. AFC, by definition, needs to be scaled for each new frequency of operation, which can be achieved using the inventive AFC concept herein described, which applies a multiplicative factor (based on an AFC word) to the fractional (numerator) term. In this manner, an AFC update is required only upon calculation of a new frequency.

In accordance with an enhanced embodiment of the present invention, a mechanism for generating a fractional 'N' word is described. A numerator generator function utilises Absolute Radio Frequency Channel Number (ARFCN) values that cover all Tx and Rx frequency channels for quad-band EGPRS transceivers.

In a further enhanced embodiment of the present invention, the frequency generation circuit encompasses and utilises the cyclical nature of the fractional (numerator) value when the frequency step (frequency channel resolution) is an integer value (M) of the crystal reference frequency. In this context, the fact that the fractional part will repeat every M integer values is utilised to reduce, to a limited set, the storage of fractional values in a look-up table in order to generate the correct fractional (numerator) value. The value of M is arranged to always be an integer value, in order to use the cyclical nature of the numerator, with or without additional scaling factors.

In contrast, known fractional 'N' synthesiser architectures generate a fractional value using dedicated hardware or look-up references for 'each' possible channel frequency value or ARFCN ( which totals 971×2 for all Quad Band Rx and TX frequencies).

Thus, the inventive concept allows for autonomous fractional (numerator) generation without incurring any extra hardware cost, by utilising the cyclic nature of the numerator when the frequency step is an integer value of the crystal reference frequency. In this manner, the inventive concept can be applied to all digital architectures that have an integer relationship between the frequency step size and crystal reference frequency and which can generate numerator values that are cyclical.

Figure 1:
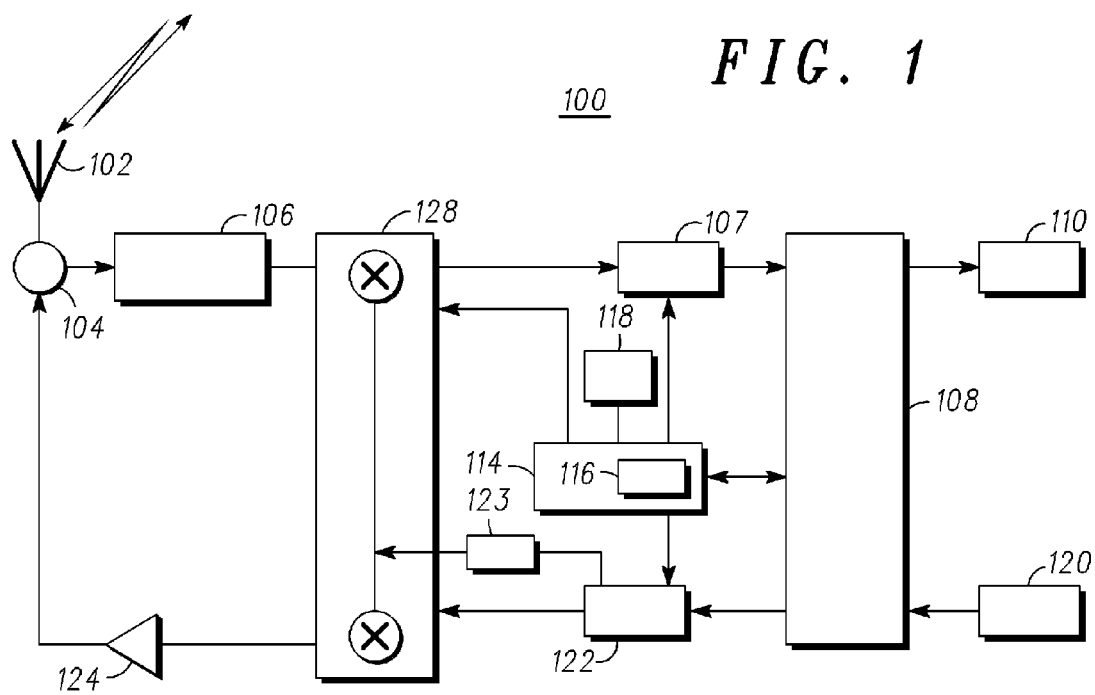
FIG. 1 illustrates a block diagram of a wireless communication unit, adapted to support the various inventive concepts of the present invention.

A block diagram of a wireless subscriber communication unit (often termed mobile station (MS)) 100 is shown in FIG. 1. The MS 100 is adapted to support the inventive concept of the preferred embodiments of the present invention. The MS 100 contains an antenna 102 preferably coupled to a duplex filter or antenna switch 104 that provides isolation between receive and transmit chains within the MS 100.

The receiver chain includes receiver front-end circuitry 106 (effectively providing reception, amplification and filtering of the received signal). The received signal is input to a frequency conversion circuit 128 that receives a reference oscillator signal from the frequency generation circuit 123. The frequency conversion circuit 128 preferably comprises mixing and amplifier elements (not shown), as known in the art. The frequency conversion circuit 128 is serially coupled to a signal processing function (generally realised by a digital signal processor (DSP)) 108 via a baseband (back-end) processing circuit 107.

A controller 114 is operably coupled to the frequency generation circuit 123 and/or frequency conversion circuit 128. A memory device 116 stores a wide array of MS-specific data, for example decoding/encoding functions, frequency and timing information for the communication unit, etc. A timer 118 is operably coupled to the controller 114 to control the timing of operations, namely the transmission or reception of time-dependent signals, within the MS 100. As known in the art, received signals that are processed by the signal processing function are typically input to an output device 110, such as a speaker or visual display unit (VDU).

The transmit chain essentially includes an input device 120, such as a microphone, coupled in series through a processor 108, transmitter/modulation circuitry 122, frequency generation/conversion circuit 128 and a power amplifier 124. The processor 108, transmitter/modulation circuitry 122 and the power amplifier 124 are operationally responsive to the controller. An output from the power amplifier is coupled to the duplex filter or antenna switch 104, as known in the art.

In accordance with a preferred embodiment of the present invention, the radio frequency generation circuit 123 incorporates a fractional 'N' frequency synthesizer arranged to have a division ratio comprising an integer and fractional part. The division ratio selects the desired channel frequency. The frequency generation circuit 123 has been adapted to incorporate a multiplicative scaling function to be operably coupled to the fractional-based synthesiser.

Known AFC apparatus may 'add' a pre-calculated value to an integer or numerator word for each channel frequency change of a fractional 'N' synthesiser. This has been identified as being inefficient by the inventors of the present invention. AFC, by definition, needs to be scaled for each new frequency of operation, which can be achieved using the multiplicative scaling function to apply a multiplication factor to un-scaled integer or numerator values to be applied to the fractional 'N' synthesiser. In the preferred embodiment of the present invention, an AFC update is required only upon calculation of a new frequency correction after a FCCH burst on the downlink channel. The new AFC value will be scaled for all channel frequency changes automatically inside the AFC apparatus 226 until the next new AFC value is calculated by the processor 108 and sent to the AFC apparatus. Thus one AFC value scaled appropriately can be used for all channel frequency changes instead of one per channel frequency change.

Furthermore, in an enhanced embodiment of the present invention, the frequency generation circuit 123 has been adapted to utilise a cyclical nature of the fractional (numerator) value when the frequency step (frequency channel resolution) is an integer value (M) of the crystal reference frequency. In this context, the fractional part will repeat (i.e. wrap around) every 'M' integer values. Thus, only a limited set of fractional values need to be stored in a look-up table, say, in memory element 116, in order to generate the correct fractional (numerator) value. In accordance with the enhanced embodiment of the present invention, the value of M is arranged to always be an integer value in order to use the cyclical nature of the numerator, with or without additional scaling factors.

Such an approach offers advantages over current frequency generation methods, whereby the fractional (numerator) value is calculated using dedicated hardware logic, or by software, and does not utilise any cyclical feature due to the frequency step and reference frequency.

Thus, in essence, the memory device 116 has also been adapted to include a reduced look-up table storing cyclical numerator values to be applied to the fractional 'N' synthesiser of the frequency generation circuit 123 of the wireless communication device 100.

Of course, the various components within the wireless communication device 100 may be realised in discrete or integrated component form. Furthermore, it is within the contemplation of the invention that the wireless communication unit 100 may be any wireless communication device, such as a portable or mobile PMR radio, a mobile phone, a personal digital assistant, a wireless laptop computer, etc.

More generally, any re-programming or adaptation of one or more software algorithms, or data banks associated with the frequency generation circuit 123, may be implemented in any suitable manner. For example, a new signal processor function or memory device may be added to a conventional wireless communication device 100. Alternatively, existing parts of a conventional wireless communication device may be adapted, for example by reprogramming one or more processors therein. As such, the required adaptation may be implemented in the form of processor-implementable instructions stored on a storage medium, such as a floppy disk, hard disk, programmable read-only memory (PROM), random access memory (RAM), or any combination of these or other storage media.

The preferred embodiment of the present invention is described with reference to the GSM standard. However, it is within the contemplation of the invention that the inventive concepts described herein equally apply to any wireless communication system.

Furthermore, although the preferred embodiment of the present invention is described with reference to a fractional 'N' synthesiser design in a MS 100, it is envisaged that the inventive concepts herein described are equally applicable to any fractional 'N' synthesiser design, for example one located in a base transceiver station (BTS).

Figure 2:
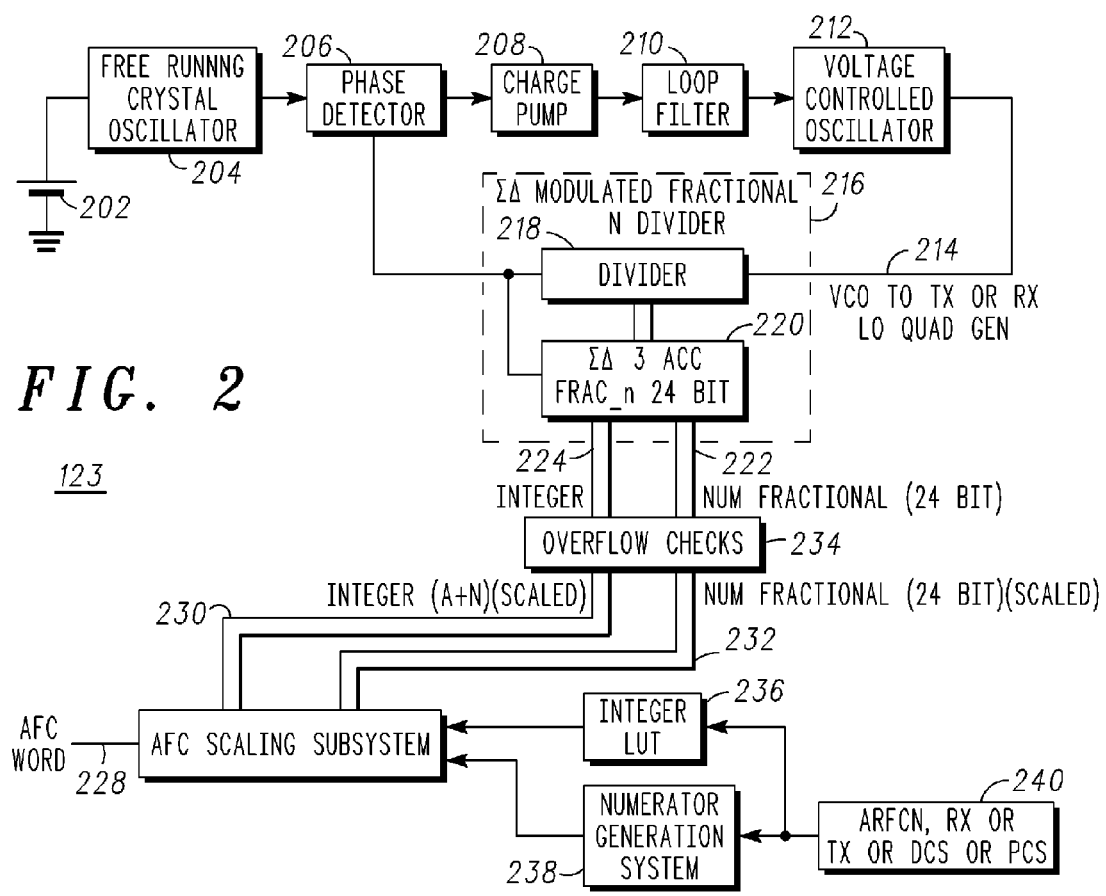
FIG. 2 illustrates a block diagram of a frequency generation circuit of a wireless communication device, adapted to support the various inventive concepts of the present invention.

Referring now to FIG. 2, the frequency generation circuit 123 of the preferred embodiment of the present invention is illustrated in greater detail. The frequency generation circuit 123 comprises a free-running crystal oscillator arrangement 202, 204 providing an oscillator signal (a reference signal e.g. 26 Mz) to a phase detector 206 of a phase locked loop circuit. The phase detector 206 detects the phase difference between the divided VCO signal 214 and the free-running crystal oscillator reference signal. The phase detector 206 outputs a signal to a charge pump 208. The charge pump 208 introduces current into, or out of, the loop filter, in proportion to the detected phase difference, as known in the art.

The charge pump output is filtered by loop filter 210 and input to a voltage-controlled oscillator (VCO) 212. In a GSM unit, the VCO output is typically arranged to be a frequency in the GHz range. The loop filter 210 is used to set the main loop dynamics as well as filtering spurs and noise. In a GSM unit, this is often configured to have a 3 dB cut-off frequency of 150 KHz in order to achieve the necessary lock time. The VCO signal 214 is fed to the Tx and/or Rx local oscillator (LO) circuits or Rx Quad generator of the wireless communication device.

The phase locked loop arrangement further comprises a fractional 'N' synthesiser design 216 operably coupling the VCO output signal to the phase detector, to maintain accurate phase control of the oscillator signal. The fractional 'N' synthesiser 216 comprises a divider 218 operably coupled to a Quantisation Noise-shaping Fractional N controller 220. This block 220 would typically comprise multiple accumulators in a sigma delta mash construct. The accumulators are typically clocked off the Feedback frequency of the PLL.

The Fractional-N numerator control word (222) sets the overflow count in the accumulators. By setting the numerator control word at different values as a factor of the maximum, in this example ($2^{24}-1$), results in a 'fraction'. This fraction sets the fractional part of the frequency resolution of the VCO signal. The final VCO frequency is $$Fref \times (integer+(numerator/(2^{24}-1)))$$

The noise shaping comes about by virtue of the mash construct in which these accumulators are coupled. The noise shaping shapes the quantisation noise for the system.

The 24-bit Quantisation Noise shaping Fractional N controller 220 is fed with two values: a first integer scaled value 224 and a second numerator (fractional 24-bit) scaled value 222, from an overflow check system 234 preceded by the AFC scaling sub-system 226. Notably, the AFC scaling sub-system 226 has been adapted, in accordance with the preferred embodiment of the present invention, by taking an AFC word 228 and using it to scale integer and fractional terms to appropriate values to accommodate every frequency that a synthesiser needs to be programmed. The AFC scaling sub-system 226 takes an AFC word 228, as defined by Equation [1] below.

$$AFCWord[(N-1):0] = \mathrm{round}\left[\frac{|XtalErr|}{MaxPPM} \cdot \{2^N - 1\}\right] \quad [1]$$

The AFC scaling sub-system 226 uses the AFC word 228 to scale the 'un-scaled' integer from the LUT 236 and fractional part from the Numerator Generation System 238 of the divide ratio. The scaled and overflow/underflow checked 234 versions of the integer and numerator 222, 224 are sent to the Fractional-N divider 218. Notably, according to the preferred embodiment of the present invention, the scaling is a multiplication scale applied to the fractional (numerator) term to accommodate 'all' frequencies, rather than an addition scale for each and every frequency, as defined in WO95/12253.

The AFC word 228 is preferably determined from a Frequency correction Channel (FCCH) RX burst in a GSM system. Timing is a critical need in s GSM system. The base station has to provide the means for a wireless communication device, i.e. a mobile, to synchronise with the master frequency of the base station. To achieve this, the base station transmits, during certain known intervals, a pure sine wave signal for the period of exactly one time-slot. The FCCH provides the wireless communication device 100 with the frequency reference of the system. The AFC word 228 is arranged to scale integer and fractional values for all subsequent channel frequencies used until a further frequency correction is needed. The AFC algorithm requires the frequency error calculated by the processor 108 from the FCCH burst and scales this with respect to the worst case reference oscillator 204 frequency error (ppm) in order to generate an AFC word that will provide a maximum frequency difference for specific bands, which are inside the 3GPP specified limits.

Notably, an indication of the ARFCN, Tx or Rx operation and mode of operation in a DCS or PCS system 240 is provided to an integer look-up table function 236 and a numerator generator function 238. These two functions 236, 238 generate appropriate un-scaled integer and fractional values, which are input to the AFC sub-scaling system 226 in order to appropriately use the AFC word 228 for scaling integer and fractional values and checked in overflow/underflow function 234 before being applied to fractional 'N' synthesiser design 216.

For the AFC method of warping the VTCXO frequency by means of a digital-to-analogue converter (DAC) (not shown), one AFC word 228 to the DAC is sufficient for all frequencies programmed to the synthesiser. Most protocol stack software in operation today uses this method. The disadvantage with this method is the analogue hardware complexity, phase noise degradation of the XTAL oscillator and the increased system cost.

In future, this will mean that platform software written for an architecture where the AFC word is updated only after a new correction value has been calculated, can easily and readily take advantage of the reduced system cost when using a free-running XTAL arrangement adapted according to the inventive concept described herein without any major software modification.

Figure 3:
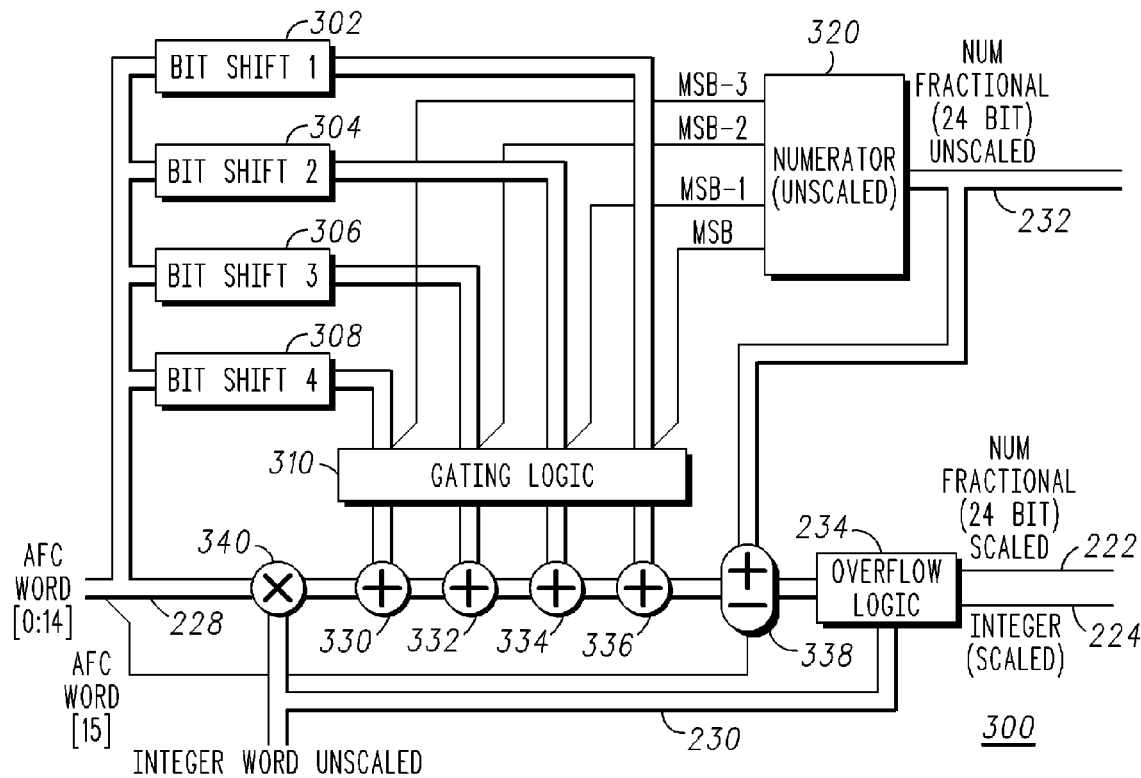
FIG. 3 illustrates a block diagram of an AFC sub-system of a wireless communication unit, adapted to support the various inventive concepts of the present invention.

Referring now to FIG. 3, a block diagram 300 of an AFC sub-system of a wireless communication device, adapted to support the various inventive concepts of the present invention, is illustrated. The AFC sub-system maintains the frequency of the oscillator 204 within the specified limits with respect to the reference frequency.

The AFC sub-system has three input signals, an un-scaled fractional numerator 232, an un-scaled integer word 230 and an AFC word 228. The un-scaled fractional numerator 232 is separated into a number of bits (i.e. most significant bits (MSBs)) 320 that are used as determining factors for a gating logic function 310. The AFC word 228 is also input to a series of bit-shift registers 302, 304, 306, 308, which shift the bit pattern of the AFC word prior to inputting to the gating logic function 310. The AFC word 228 is also input to a multiplier 340, where it is used to multiply the un-scaled integer word 320.

The output of the multiplier 340 is input to a series of adder functions 330, 332, 334 and 336, which are gated 310 ('anded' in the preferred embodiment) with the MSB bits of the numerator 320. If the Numerator MSBs are 'zero' then the gating of these MSBs with the corresponding bit shifts 302, 304, 306 and 308 will result in a zero resultant to the relevant adder 330, 332, 334 and 336. The MSB bits of the numerator need not gate the bits shifters outputs.

The bit shifts can also be controlled by combinatorial logic not related to the numerator values. In a preferred embodiment some of the bit shifts can be controlled by combinatorial logic controlled by Transmit, Receive and band selection signals. The resultant value after the chain of adders can be truncated to an 'N−1' bit word. The non-truncated or truncated value is added or subtracted from the RAM Numerator value dependent on the MSB bit of the AFC word 228 from the processor.

A bypass multiplexer may be added before the adder/subtractor 338 in order to allow the bypass of the AFC apparatus, thus allowing serial-parallel interface (SPI) written AFC value to be added or subtracted to, or from, the numerator.

The number of bit-shift register elements and adders in FIG. 3 has been set to four for explanatory purposes only. It is envisaged that the number of elements may be more or less, dependent upon the desired accuracy. As a general rule, the more adders and bit shift elements that are combined with the gating elements, as selected from the 'un-scaled' numerator word, the more frequency error correction there will be, resulting in a more accurate frequency.

A bit shift of '−1' 302 is the same as halving the magnitude of the AFC word. The output of the adder chain 330, 332, 334, 336 is either added or subtracted 338 from the numerator, depending upon the sign bit of the 16-bit AFC word. The resultant word is checked for overflow or under flow conditions in overflow logic function 234. This will result in decrementing or incrementing the integer part of the tuning word to the synthesiser, dependent on whether the numerator values overflows or underflows.

The digital baseband circuitry uses equation [2] to generate the AFC word:

$$AFCWord[(N-1):0] = \text{round}\left[\frac{|XtalErr(PPM)|}{MaxPPM} \cdot \{2^N - 1\}\right] \quad [2]$$

where:
XtalErr represents the absolute error in the XTAL frequency in PPM;
1MaxPPM is the full scale of the algorithm, which in the preferred embodiment is 30 ppm;
N represents the AFC word bus width, which in the preferred embodiment is N=15 (16-bit bus, 15 to 0).

It is noteworthy that in equation [2] the AFC Word has a length of 'N−1' bits. The MSB is added by noting the sign of the XtalErr. The AFC word calculated from equation [2] can be either positive or negative, representing a required positive or negative frequency error correction. The magnitude of the XtalErr is captured in equation [2]. In this preferred embodiment, if the XtalErr is positive then the MSB of the AFC Word is signed with a '0' (a subtracting term from the numerator). If the AFC word is negative the MSB is signed with a '1' (an adding term to the numerator).

The effect of using this type of AFC sub system is that the frequency difference between the correct frequency and the AFC adjusted frequency over the Frequency channel of interest in terms of PPM versus the XTAL PPM error is within the specified limits of 3GPP over the required bands.

Thus, a novel element of a 'multiplicative' scaling function has been added to an AFC correction apparatus, such that an AFC update is required only upon calculation of a new frequency.

Figure 4:
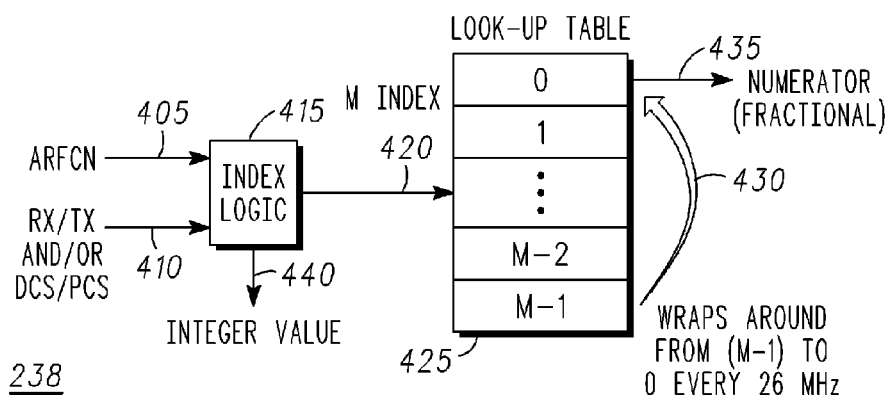
FIG. 4 shows a block diagram of a numerator generation function, adapted to support the various inventive concepts of the present invention.

In accordance with an enhanced embodiment of the present invention, a mechanism for generating a fractional 'N' AFC word is described. The numerator generator function, say numerator generator function 238 of FIG. 2, is further described with respect to FIG. 4. Typically, as mentioned previously, all fractional (numerator) values for all the operating frequency values are stored in a look-up table. There are '971' Absolute Radio Frequency Channel Number (ARFCN) values that cover all Tx and Rx frequency channels for quad-band EGPRS transceivers. Thus, by incorporating the inventive concept herein described above, only a small number of numerator values need to be stored.

The following is a preferred specific implementation of the enhanced embodiment of the present invention. Given an accurate 26 MHz reference crystal, the numerator values cycle every 130 numerators to cover all quad-bands. This happens when there is no division of the VCO feedback frequency back to the Fractional N Sythesiser 216 and when the frequency step of 200 KHz is an integer value of the 26 MHz crystal frequency. Using this cyclical feature, a set of 'M' (i.e. 130) numerator values can be stored in a lookup table, and indexed by M for all quad-band Channels.

In an enhanced embodiment of the present invention, an 'M' index value 420 can be generated from the ARFCN 405 of the required channel, Rx or Tx mode signals and a signal to distinguish between DCS and PCS operation 410, i.e. Direct Communication System (DCS) at 900 MHz or Personal communication system (PCS) at 1800 MHz, which have overlapping ARFCN numbers.

For every ETSI ARFCN channel frequency 405 the integer and fractional values for the synthesizer have to be calculated or looked up by reference. The Integer N and A values can be derived directly from the ARFCN value 405, by index logic function 415. The generation of the Integer values 440 can be calculated from combinatorial logic 415 or LUT, according to the ARFCN number generation information as specified in Digital Cellular Telecommunication System—Radio Transmission and Reception—3GPP TS 05.05

Therefore, only a limited set 'M' numerator values (130) for a 26 MHz reference crystal frequency and 200 KHz frequency step, are required to cover all 971 ARFCN, as the numerators are cyclic 430 from '0' to 'M−1', over the four frequency bands. Thus, the M set of Numerator values are stored in a look-up table 425 and indexed by M 420 for both low-band and high-band when the frequency step is an integer value of the crystal reference frequency. Notably, the indexed output is used as the fractional part 435 of the divide ratio, after AFC and overflow check function are applied.

$$200 \text{KHz} = \text{Scale} \times \left(\frac{Num}{2^{24}}\right) \times 26 \text{MHz} \quad [3]$$

$$2^{24} = \text{Fractional}N \text{ (Bit Resolution)}$$

$$\frac{200 \text{KHz} \times 2^{24}}{\text{Scale} \times 26 \text{MHz}} = Num \ 26 \text{MHz} = \text{Crstyal Frequency}$$

$$M \times \left(\frac{200 \text{KHz} \times 2^{24}}{\text{Scale} \times 26 \text{MHz}}\right) = M \times Num$$

$$200 \text{KHz} = \text{Frequency step (Channel Resolution)}$$

According to Equation 3, as 'M' increases in integer values the numerator will increase until the numerator value wraps around, even if the 'M' value keeps increasing. Therefore, a low value of 'M' will produce the same value of numerator as a high value of 'M' after the numerator value has wrapped around. Therefore, there is only a finite set of 'M' values required to cover the full range of the numerator values. This is the consequence if there are an integer number of Channel resolutions in the crystal reference frequency.

Thus, M is generated from the programmed ARFCN, Rx or Tx mode signals and the DCS and PCS signal (which have overlapping ARFCN). These input signals define a specific Channel frequency, according to Digital Cellular Telecommunication System—Radio Transmission and Reception—3GPP TS 05.05 standard. Once the specific frequency channel is known the combinatorial logic 415 will generate an index 'M' (Equation 3) to look up the correct numerator (fractional) value and generate the correct integer value 440 for this specific channel frequency.

Only one numerator value 435 needs to be accessed from the look-up table 425, and this numerator value is passed directly to the divider control circuit with AFC and overflow modifications, if required. Only a limited set of numerator values need to be stored, using the cyclic nature of the aforementioned inventive concept. Advantageously, the band select information ('N' and 'A' integer values) 440 may also be generated from the index logic function 415 as previously discussed.

Although the preferred embodiment of the present invention is described with reference to a GSM-based transceiver using a 26 MHz crystal with a frequency step of 200 KHz and the 130 cyclical numerator values, it is envisaged that the inventive concepts are equally applicable to any case where a fractional division based synthesiser has a numerator value that is cyclical and the frequency step and reference crystal frequency are configured to have an integer relationship.

Figure 5:
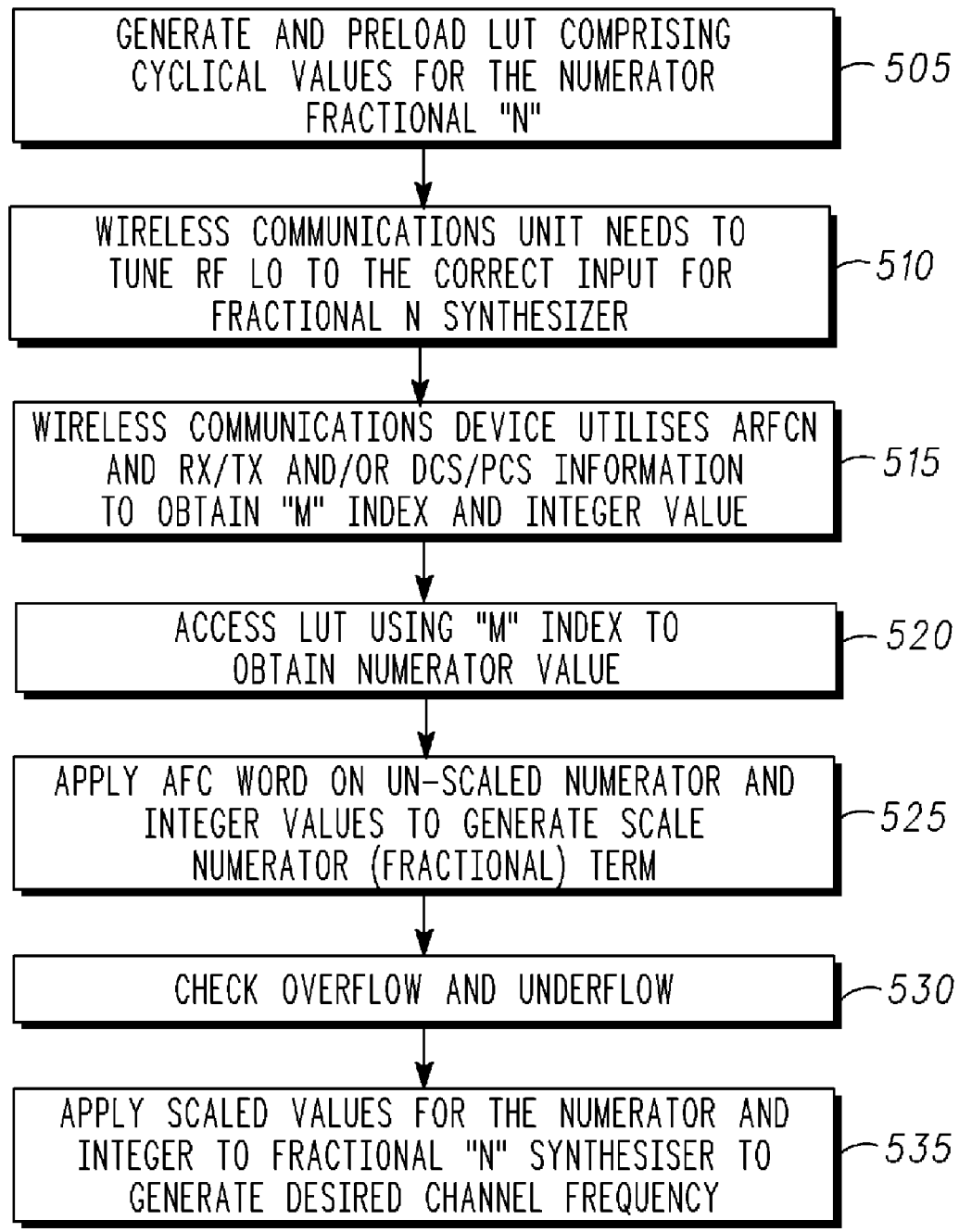
FIG. 5 shows a flowchart of a frequency generation mechanism according to the preferred embodiment of the present invention.

Referring now to FIG. 5, a flowchart 500 illustrates an overview of the frequency generation process according to the preferred embodiment of the present invention. The process starts with the generation of a set of cyclical values for the numerator of a fractional 'N' synthesiser (generated once the frequency plan is known), which are stored in a look-up table, as shown in step 505. The set of cyclical values is determined as previously described with reference to FIG. 2, FIG. 3 and FIG. 4. When a wireless communication device needs to transmit or receive communications at a particular frequency, the wireless communication device needs to generate the correct input values for the Fractional N synthesizer, as in step 510.

The wireless communication device preferably utilises the ARFCN value and Rx/Tx information as well as an indication of whether the desired communication channel is in, say, a DCS/PCS frequency band. This information is used to obtain an 'M' index value and generate the correct integer value, in step 515. The 'M' index value is used to access a desired numerator value from the LUT, as shown in step 520.

Thus, un-scaled values for the numerator and a fractional 'N' synthesiser integer value are identified, and together with an AFC word, applied to a scaling sub-system, as in step 525. Notably, the AFC word comprises a fractional (numerator) multiplier function to scale the fractional term (value) in a multiplicative manner. The scaling sub-system scales these input values to obtain a scaled numerator and integer value in step 530, which are checked for overflow and underflow before being applied to the fractional 'N' synthesiser to obtain a desired Channel frequency, as shown in step 535.

It is envisaged that integrated circuit manufacturers are able to manufacture integrated circuits comprising the aforementioned fractional 'N' synthesiser elements/components and arranged to perform voltage controlled oscillator functions based on the new configuration, as hereinbefore described.

Although the present invention has been described with reference to fractional 'N' synthesiser designs, it is envisaged that the inventive concepts described are equally applicable to any transceiver where an accurate free running XTAL is used. The enhanced embodiment of the present invention can be employed if the frequency step is an integer value of the XTAL frequency. It can also be used as an enabler to re-use software developed for a standard VTCXO system. In particular it is envisaged that the inventive concepts are most applicable, at the present time, to EDGE/GPRS transceivers.

It will be understood that the frequency generation mechanism, as described above, provides singly or in combination at least some of the following advantages:
 (i) It saves on hardware and software overhead associated with frequency channel selection for fractional-N type synthesizers. The processor only needs to program a small set of signals and the fractional 'N' generation arrangement will automatically generate the correct channel frequency. The AFC sub-system simplifies the correct frequency generation required for channel selection as the AFC value is scaled appropriately over the all the frequency channel requirement.

(ii) There is no need for dedicated hardware, software or look-up references for every (2×971) possible frequency value. It reduces the amount of data required from the processor, the number of calculations and is user friendly as the algorithm is hidden inside the generation system 123.

(iii) As the proposed fractional 'N' generation arrangement is smaller in hardware and area costs, it is more efficient and easier to debug and re-program. In this regard, the numerator values can be programmed according to the frequency plan requirements for the system and are not hard coded into the system.

(iv) Allows protocol stack software, designed for a wireless communication device operating with a VTCXO, to be re-used with a less-expensive free-running XTAL; and (v) The preferred embodiment provides reduced memory requirements over known LUT-based designs.

Whilst specific, and preferred, implementations of the present invention are described above, it is clear that one skilled in the art could readily apply variations and modifications of such inventive concepts.

Thus a wireless communication device and a method for generating a radio frequency signal in a wireless communication device have been provided where the disadvantages described with reference to prior art arrangements have been substantially alleviated.

The invention claimed is:

1. A wireless communication device comprises:
a frequency generation circuit employing a crystal oscillator operably coupled to a fractional-based synthesiser and a voltage controlled oscillator, wherein the fractional-based synthesiser utilises a ratio between an integer value and a fractional value to set a radio frequency signal of the voltage controlled oscillator;
an automatic frequency control scaling sub-system is operably coupled to the fractional-based synthesiser and configured to receive and use a single AFC word to frequency scale the fractional value in a multiplicative manner to generate substantially all desired radio frequencies from the voltage controlled oscillator.

2. The wireless communication device according to claim 1 further characterised in that the AFC word comprises a fractional multiplier.

3. The wireless communication device according to claim 1, further characterised in that the AFC word is substantially of the form:

$$AFCWord[(N-1):0] = \text{round}\left[\frac{|XtalErr|}{MaxPPM} \cdot \{2^N - 1\}\right].$$

4. The wireless communication device according to claim 1, further characterised in that a most significant bit of the AFC word determines a sign of a phase error of the fractional-based synthesiser.

5. A wireless communication device according to claim 1, further characterised in that a frequency step value of the fractional-based synthesiser is arranged to be an integer value (M) of the crystal oscillator to enable the fractional value to be cyclical in supporting the radio frequency signals of the voltage controlled oscillator.

6. The wireless communication device according to claim 5 further characterised by a memory element operably coupled to the fractional-based synthesiser and arranged to store a cyclic set of fractional values.

7. The wireless communication device according to claim 5 further characterised by a numerator generator function arranged to generate integer and numerator values from one or more of:
(i) An absolute radio frequency channel number;
(ii) An operational mode of the wireless communication device;
(iii) A transmit or receive mode of operation of the wireless communication unit; or
(iv) A wireless communication set of frequencies supported by the wireless communication device.

8. The wireless communication device according to claim 1, wherein the wireless communication device is one of a portable or mobile radio, a mobile phone supporting one or more cellular communication standards such as GSM, 3GPP, GPRS, EGPRS, EGSM, a personal digital assistant, a wireless capable laptop computer.

9. An integrated circuit comprising:
a frequency generation circuit and a fractional-based synthesiser for operably coupling to a crystal oscillator and a voltage controlled oscillator, wherein the fractional-based synthesiser utilises a ratio between an integer value and a fractional value to set a radio frequency signal of the voltage controlled oscillator;
an automatic frequency control scaling sub-system, operably coupled to the fractional-based synthesiser and configured to receive and use a single AFC word to frequency scale the fractional value in a multiplicative manner to generate substantially all desired radio frequencies from the voltage controlled oscillator.

10. A method of generating a radio frequency signal in a wireless communication device comprising a frequency generation circuit employing a crystal oscillator operably coupled to a fractional-based synthesiser and a voltage controlled oscillator, wherein the fractional-based synthesiser utilises a ratio between an integer value and a fractional value to set a radio frequency signal of the voltage controlled oscillator, the method comprising:
receiving a single AFC word; and
scaling, using the AFC word, the fractional value in a multiplicative manner, to generate substantially all desired radio frequencies from the voltage controlled oscillator.

11. A method of generating a radio frequency signal according to claim 10 further comprising:
generating a set of cyclical values for a numerator of a fractional 'N' synthesiser; and
storing the set of cyclical fractional values in a memory element such that only a limited number of fractional values are scaled in a multiplicative manner.

12. A method of generating a radio frequency signal according to claim 11 further comprising:
utilising one or more of an absolute radio frequency channel number;
an operational mode of the wireless communication unit;
an indication of whether the desired communication channel is in a DCS/PCS frequency band; and
obtaining a desired fractional value from a memory unit and the integer value from combinatorial logic or memory unit.

13. A wireless communication device comprises:
a frequency generation circuit employing a crystal oscillator operably coupled to a fractional-based synthesiser and a voltage controlled oscillator, wherein the fractional-based synthesiser utilises a ratio between an integer value and a fractional value to set a radio frequency signal of the voltage controlled oscillator;
the wireless communication unit:
the frequency step value of the fractional-based synthesiser is arranged to be an integer value of the crystal oscillator to enable the single fractional value to be cyclical to generate substantially all desired radio frequency signals of the voltage-controlled oscillator.

14. The wireless communication device according to claim 13 further characterised by a memory element operably coupled to the fractional-based synthesiser and arranged to store a cyclic set of fractional values.

15. The wireless communication device according to claim 13, further characterised by combinatorial logic coupled to the fractional-based synthesiser and arranged to generate integer values.

16. The wireless communication device according to claim 13, further characterised by a numerator generator function operably coupled to the fractional-based synthesiser and arranged to generate integer and fractional values from one or more of:
  (i) An absolute radio frequency channel number;
  (ii) An operational mode of the wireless communication unit;
  (iii) A transmit or receive mode of operation of the wireless communication device; or
  (iv) A wireless communication set of frequencies supported by the wireless communication device.

* * * * *